(12) United States Patent
McKee et al.

(10) Patent No.: US 8,723,094 B2
(45) Date of Patent: May 13, 2014

(54) PHOTODETECTING IMAGER DEVICES HAVING CORRELATED DOUBLE SAMPLING AND ASSOCIATED METHODS

(75) Inventors: Jeffrey McKee, Tualatin, OR (US); Jutao Jiang, Tigard, OR (US)

(73) Assignee: Sionyx, Inc., Beverly, MA (US)

(*) Notice: Subject to any disclaimer, the term of this patent is extended or adjusted under 35 U.S.C. 154(b) by 126 days.

(21) Appl. No.: 13/333,537

(22) Filed: Dec. 21, 2011

(65) Prior Publication Data
US 2012/0326008 A1 Dec. 27, 2012

Related U.S. Application Data

(60) Provisional application No. 61/425,654, filed on Dec. 21, 2010.

(51) Int. Cl.
*H01L 27/00* (2006.01)
(52) U.S. Cl.
USPC .................................................... 250/208.1
(58) Field of Classification Search
USPC ........................................ 250/208.1; 348/241
See application file for complete search history.

(56) References Cited

U.S. PATENT DOCUMENTS

| | | | |
|---|---|---|---|
| 7,542,085 B2 | 6/2009 | Altice et al. | |
| 2007/0235827 A1 | 10/2007 | Altice | |
| 2008/0266434 A1* | 10/2008 | Sugawa et al. | 348/308 |
| 2009/0200454 A1 | 8/2009 | Barbier et al. | |

OTHER PUBLICATIONS

CMOSIS; "Global Shutter Image Sensors for Machine Vision Application"; Image Sensors Europe 2010, Mar. 23-25, 2010; © copyright 2010.
Kryski; A High Speed 4 Megapixel Digital CMOS Sensor; 2007 International Image Sensor Workshop; Jun. 6-10, 2007.
Meynanis, et al.; "Backside illuminated global shutter COMOS image sensors"; 2011 International Image Sensor Workshop; Jun. 11, 2011.
Takayanagi, et al.; "A 600×600 Pixel, 500, fps CMOS Image Sensor with a 4.4 jum Pinned Photodiode 5-Transistor Global Shutter Pixel"; 2007 International Image Sensor Workshop; Jun. 6-10, 2007.
Yasutomi, et al.; "Two-Stage Charge Transfer Pixel Using Pinned Diodes for Low-Noise Global Shutter Imaging"; 2009 International Image Sensor Workshop; Mar. 28, 2009.

* cited by examiner

*Primary Examiner* — Thanh Luu
*Assistant Examiner* — Renee Naphas
(74) *Attorney, Agent, or Firm* — Thorpe North & Western LLP (57) ABSTRACT

Transistor pixel devices, imagers, and associated methods are provided. In one aspect, a transistor pixel device includes a photodiode coupled to a floating diffusion region (FD), a storage node (SN), and a power supply, wherein the FD is coupled between the photodiode and the power supply. The device also includes a first global transfer transistor coupled between the photodiode and the FD for gating between the photodiode and the FD and a second global transfer transistor coupled between the FD and the SN for gating between the FD and the SN. A global reset select transistor is coupled between the FD and the power supply, wherein an open state of the global reset select transistor prevents accumulation of electrical charge at the photodiodes. A source follower transistor is coupled to the FD and to the power supply, where the source follower is operable to receive electrical signal from the FD.

10 Claims, 9 Drawing Sheets

PHOTODETECTING IMAGER DEVICES HAVING CORRELATED DOUBLE SAMPLING AND ASSOCIATED METHODS

PRIORITY DATA

This application claims the benefit of U.S. Provisional Patent Application Ser. No. 61/425,654, filed on Dec. 21, 2010, which is incorporated herein by reference.

BACKGROUND

The interaction of light with semiconductor materials has been an important innovation. Silicon imaging devices are used in various technologies, such as digital cameras, optical mice, video cameras, cell phones, and the like. Charge-coupled devices (CCDs) were widely used in digital imaging, and were later improved upon by complementary metal-oxide-semiconductor (CMOS) imagers having increased performance. CMOS sensors are typically manufactured from silicon and can covert visible incident light into a photocurrent and ultimately into a digital image. Silicon-based technologies for detecting infrared incident electromagnetic radiation have been problematic, in part, because silicon is an indirect bandgap semiconductor having a bandgap of about 1.1 eV. Thus, the absorption of electromagnetic radiation having wavelengths of greater than about 1100 nm is, therefore, very low in silicon.

SUMMARY

The present disclosure provides transistor pixel devices, imagers, and associated methods. In one aspect, for example, a transistor pixel device can include a photodiode coupled to a floating diffusion region, a storage node, and a power supply, wherein the floating diffusion region is coupled between the photodiode and the power supply. The device can also include a first global transfer transistor coupled between the photodiode and the floating diffusion region for gating between the photodiode and the floating diffusion region and a second global transfer transistor coupled between the floating diffusion region and the storage node for gating between the floating diffusion region and the storage node. A global reset select transistor can be coupled between the floating diffusion region and the power supply, wherein an open state of the global reset select transistor prevents accumulation of electrical charge at the photodiodes. Additionally, a source follower transistor can be coupled to the floating diffusion region and to the power supply, where the source follower is operable to receive electrical signal from the floating diffusion region. In another aspect, the device can further include an optional row select transistor coupled to the source follower transistor, wherein the row select transistor is operable to read out signal from a row of pixel devices.

In another aspect, a photodiode imager device is provided. Such a device can include a plurality of transistor pixel devices, as described above for example, arranged into a plurality of rows, where the first global transistors from the plurality of transistor pixel devices are electrically coupled together, the second global transistors from the plurality of transistor pixel devices are electrically coupled together, and the global reset select transistors from the plurality of transistor pixel devices are electrically coupled together. In some aspects, each transistor pixel device is a five transistor pixel device including a row select transistor coupled to the source follower transistor. In one aspect, the device has a structure that is operable to provide correlated double sampling. In another aspect, the device has a structure that is operable to provide anti-blooming protection. In yet another aspect, the device has a structure that is operable to provide correlated double sampling and anti-blooming protection.

In yet another aspect of the present disclosure, a method is provided of timing a photodiode imager device, such as has been described for example, to function in a global shutter mode. Such a method can include pulsing first global transfer transistors and global reset select transistors to a high state then to a low state to reset the photodiodes and start integration, and terminating integration by pulsing global reset select transistors to a high state then to a low state and setting second global transfer transistors to a high state to reset the storage node to a first voltage level corresponding to a low power supply setting. The method can further include setting first global transfer transistors to a high state while second global transfer transistors are set to high substantially at the same time to globally transfer electrical charge from the floating diffusion regions to the storage nodes, and reading out the electrical charge in each of the plurality of rows using row select transistors.

Such a method can further include correlated double sampling of the read out of the electrical charge in each of the plurality of rows. In one aspect, the correlated double sampling includes setting the global reset select transistor of a row being read to a high state and setting the power supply to a high power supply setting to set the floating diffusion regions to the high power supply setting in the row being read, and reading the electrical charge in the floating diffusion regions and obtaining a first electrical charge value. The method can further include setting the second transfer global transistor of the row being read to a high state to transfer electrical charge in the storage nodes to the floating diffusion regions of the row being read, reading the electrical charge in the floating diffusion regions and obtaining a second electrical charge value, and subtracting the second electrical charge value from the first electrical charge value to obtain a correlated double sampling output.

Additionally, reading out the electrical charge in each of the plurality of rows includes anti-blooming protection. In one aspect, anti-blooming protection further includes setting the global reset select transistors and the first global transfer transistors to an ON state for rows that are not in integration or readout to provide anti-blooming protection, and selecting a row to be read. The method further includes disconnecting the row select transistor and the first global transistor from the anti-blooming protection for the row to be read, setting the row select transistor to a high state for the row to be read and reading the electrical charge in the row to be read, and resetting the row select transistor and the first transfer global transistor back to the anti-blooming state for the row that was read.

In yet another aspect of the present disclosure, a method is provided of timing a photodiode imager device, such as has been described for example, to function in a global shutter mode. Such a method can include pulsing first global transfer transistors and global reset select transistors to a high state then to a low state to reset the photodiodes and start integration, and terminating integration by pulsing global reset select transistors to a high state then to a low state and setting second global transfer transistors to a high state to reset the storage node to a first voltage level corresponding to a low power supply setting. The method can further include setting first global transfer transistors to a high state while second global transfer transistors are set to high substantially at the same time to globally transfer electrical charge from the floating diffusion regions to the storage nodes, and reading out the electrical charge in each of the plurality of rows.

In one specific aspect, reading out the electrical charge in each of the plurality of rows further includes selecting a row to be read, setting the global reset select transfer transistor for the selected row to high, and setting the power supply to a sufficiently low setting to reset the floating diffusion region of the selected row to substantially 0.0V to turn off the source follower transistor of the selected row.

BRIEF DESCRIPTION OF THE DRAWINGS

For a fuller understanding of the nature and advantage of the present disclosure, reference is made to the following detailed description of embodiments herein in connection with the accompanying drawings, in which.

DETAILED DESCRIPTION

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" can include plural referents unless the context clearly dictates otherwise. Thus, for example, reference to "a dopant" can include one or more of such dopants and reference to "the layer" can include reference to one or more of such layers.

As used herein, the terms "light" and "electromagnetic radiation" can be used interchangeably and can refer to light or electromagnetic radiation in the ultraviolet, visible, near infrared, and infrared spectra. The terms can further more broadly include electromagnetic radiation such as radio waves, microwaves, x-rays, and gamma rays. Thus, the term "light" is not limited to electromagnetic radiation in the visible spectrum. Many examples of light described herein refer specifically to electromagnetic radiation in the visible and infrared (and/or near infrared) spectra. For purposes of this disclosure, visible range wavelengths are considered to be from approximately 350 nm to 800 nm and non-visible wavelengths are longer than about 800 nm or shorter than about 350 nm. The infrared spectrum includes a near infrared portion of the spectrum including wavelengths of approximately 800 to 1100 nm, a short wave infrared portion of the spectrum including wavelengths of approximately 1100 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, "quantum efficiency" (QE) is defined as the percentage of photons incident on an optoelectronic device that are converted into electrons. External QE (EQE) is defined as the current obtained outside of the device per incoming photon. As such, EQE therefore depends on both the absorption of photons and the collection of charges. The EQE is lower than the QE due to recombination effects and optical losses (e.g. transmission and reflection losses).

As used herein, the terms "disordered surface" and "textured surface" can be used interchangeably, and refer to a surface having a topology with nano- to micron-sized surface variations. Such a surface topology can be formed by the irradiation of a laser pulse or laser pulses, chemical etching, lithographic patterning, interference of multiple simultaneous laser pulses, or reactive ion etching. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 1 μm to about 60 μm). In yet another aspect, the surface can include nano-sized and/or micron-sized structures from about 5 nm and about 500 μm.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser irradiation, chemical etching, reactive ion etching, lithographic patterning, etc. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified. The target region of a semiconductor material can vary as the surface modifying process progresses. For example, after a first target region is doped or surface modified, a second target region may be selected on the same semiconductor material.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

The following disclosure relates to broadband photosensitive diodes, pixels, and imagers capable of detecting visible as well as infrared light, including associated methods of making such devices. In some aspects, a photosensitive device can include a semiconductor substrate having multiple doped regions forming at least one junction. In one aspect, the photosensitive device can further include at least one textured region coupled to the semiconductor substrate and positioned to interact with electromagnetic radiation. In some aspects, doped regions can include an n-type dopant and/or a p-type dopant, thereby creating a p-n junction. In other aspects, a photosensitive device can include an i-type region to form a p-i-n junction.

In another aspect, a photosensitive pixel can include a semiconductor substrate having multiple doped regions forming at least one junction, at least one textured region coupled to the semiconductor substrate and positioned to interact with electromagnetic radiation, and an electrical transfer element coupled to the semiconductor substrate and operable to transfer an electrical signal from the at least one junction. A photosensitive imager can include multiple photosensitive pixels. Additionally, an electrical transfer element can include a variety of devices, including without limitation, transistors, transfer gates, MOSFETs, PMOS transfer gates, and the like.

Photosensitive or photodetecting imagers include photodiodes or pixels that are operable to absorb electromagnetic radiation within a given wavelength range. Such imagers can be passive pixel sensors (PPS), active pixel sensors (APS), digital pixel sensor imagers (DPS), or the like, with one difference being the image sensor read out architecture. For example, a semiconducting photosensitive imager can be a three, four, five or six transistor active pixel sensor (3T, 4T, 5T, or 6T APS). Devices having greater than 6 transistors are also within the present scope.

Photosensitive imagers can be front side illumination (FSI) or back side illumination (BSI) devices. In a typical FSI imager, incident light enters the semiconductor device by first passing by transistors and metal circuitry. The light, however, scatters off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. BSI imagers, one the other hand, are configured to have the light sensing portion of the device opposite the transistor and circuitry. Incident light enters the device via the light sensing portion and is mostly absorbed prior to reaching the circuitry. BSI designs allow for smaller pixel architecture and a high fill factor for the imager. As mentioned, the devices according to aspects of the present disclosure can be adapted for either configuration. It should also be understood that devices according to aspects of the present disclosure can be incorporated into complimentary metal-oxide-semiconductor (CMOS) imager architectures or charge-coupled device (CCD) imager architectures.

A photosensing imager, photodiode or pixel having enhanced quantum efficiency in various wavelengths at least in the range of about 400 nm to about 1300 nm has been disclosed in U.S. application Ser. No. 12/885,158, filed on Sep. 17, 2010, and is incorporated herein by reference in its entirety.

Many current CMOS image sensors operate in a rolling shutter mode to capture an image. In such a rolling shutter image sensor, each pixel row starts integration at different times. In situations involving movement, the visual image may have moved between the time integration begins in the first row of pixels and the time integration begins in the last row of pixels, resulting in motion artifacts. Thus for many applications, a global shutter mode can be preferable. A global shutter sensor differs from a rolling shutter in that every pixel in the pixel array starts integration at the same time, thereby reducing or eliminating motion artifacts that have previously been the result of integration time disparities.

Figure 1:
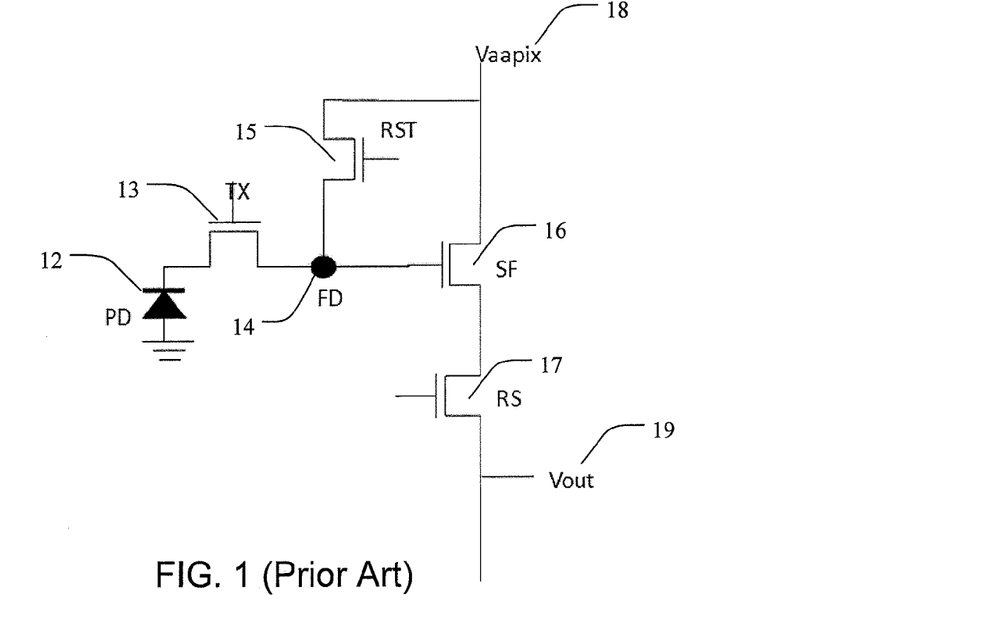
FIG. 1 is a schematic of a CMOS imager of a prior art device.

In principle, a 4-transistor (4T) CMOS imager could be operated in a global shutter mode as shown in FIG. 1. The elements of the 4T CMOS pixel, as shown in FIG. 1, include a photodiode (PD) 12, a transistor (TX) 13, a floating diffusion region (FD) 14, a reset (RST) 15, source follower (SF) 16, a row select (RS) 17, a power supply voltage for the pixel array (Vaapix) 18, and the voltage out (Vout) 19. Such an architecture with this specific configuration, however, exhibits several disadvantages. For example this 4T CMOS imager would not have anti-blooming protection, nor would it be capable of correlated double sampling (CDS), and thus could have a higher read noise floor. In addition, the imager would not be able to integrate and read out a signal in parallel, thereby making it unsuitable for high speed applications.

Figure 2:
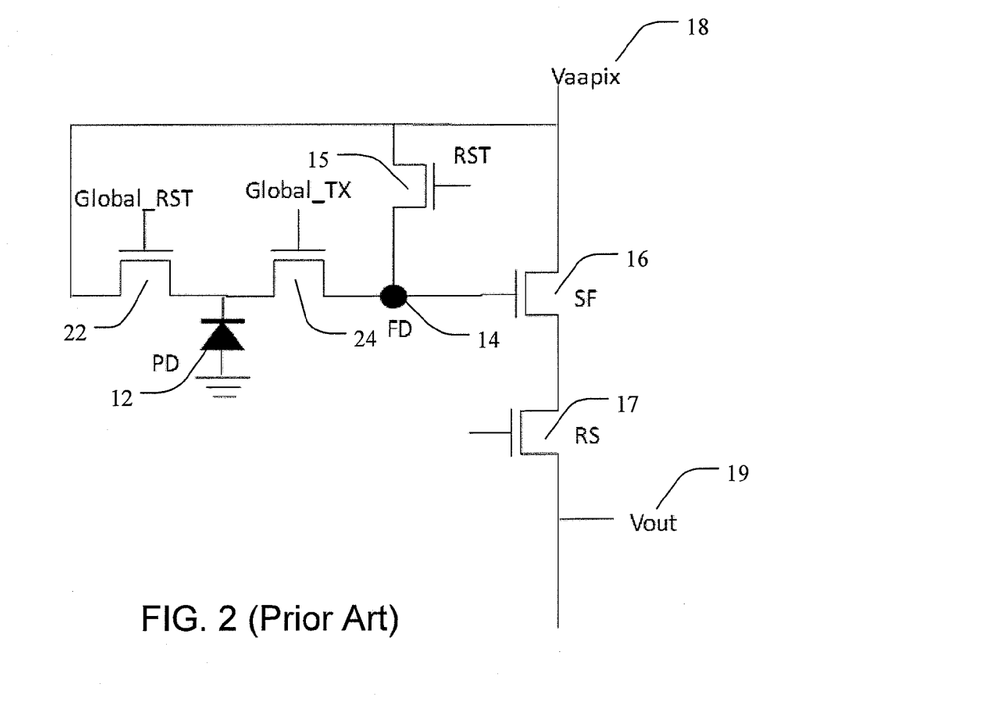
FIG. 2 is a schematic of a CMOS imager of a prior art device.
Figure 3:
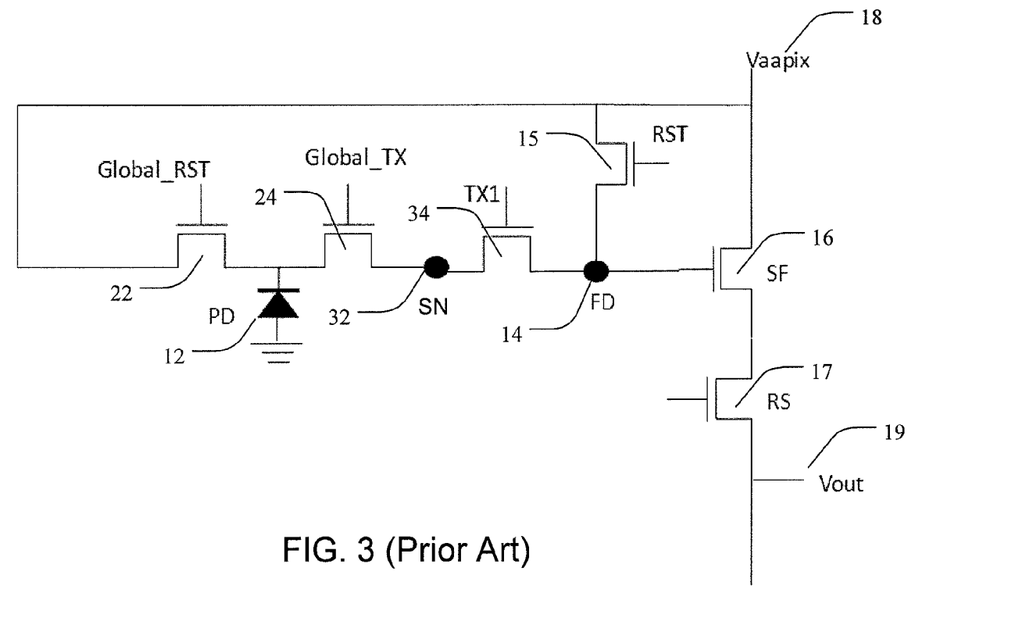
FIG. 3 is a schematic of a CMOS imager of a prior art device.

Additionally, 5T pixel and 6T pixel global shutter architectures, as shown in FIGS. 2 and 3, respectively, are another possibility. Note that all of the figures that have common callout enumeration are considered to be substantially equivalent elements, and thus may or may not be described separately in each figure. In FIG. 2, a 5T CMOS pixel architecture can include some of the same elements as the 4T architecture in FIG. 1 with the addition of a global reset transistor (Global_RST) 22 and a global transistor (Global_TX) 24. The 5T pixel architecture can be operated in a global shutter mode, and thus the integration and readout can be performed simultaneously. However, the 5T architecture shown in FIG. 2 cannot have CDS operation because resetting the pixel resets the signal. As a result, the read noise will be large. In FIG. 3, a 6T pixel architecture is shown that is similar to the 5T pixel architecture of FIG. 2 with the addition of a storage node 32 and a first transistor (TX1) 34. As shown in FIG. 3, this 6T architecture can have CDS operation. However, due to the unique architecture, the photodiode fill factor of the 6T architecture will be small. Additionally, another common issue for traditional 5T and 6T pixel architectures is a possible higher dark current because two transistors are directly connected to photodiode.

The present disclosure provides a pixel architecture that allows global shutter functionality with anti-blooming protection, CDS operation, or both anti-blooming protection and CDS operation. Additionally, the pixel architecture can have a large fill factor. In some aspects, the pixel architecture can have 5 transistors or 4 transistors, depending on the technique used to read out the pixel rows. In one aspect, for example, a transistor pixel device can include a photodiode coupled to a floating diffusion region, a storage node, and a power supply, wherein the floating diffusion region is coupled between the photodiode and the power supply. The device can further include a first global transfer transistor coupled between the photodiode and the floating diffusion region for gating between the photodiode and the floating diffusion region, a second global transfer transistor coupled between the floating diffusion region and the storage node for gating between the floating diffusion region and the storage node, a global reset select transistor coupled between the floating diffusion region and the power supply, wherein an open state of the global reset select transistor prevents accumulation of electrical charge at the photodiodes, and source follower transistor coupled to the floating diffusion region and to the power supply, the source follower being operable to receive electrical signal from the floating diffusion region. In some aspects, the device can further include a row select transistor coupled to the source follower transistor, wherein the row select transistor is operable to read out signal from a row of pixel devices. As such, in one aspect the device is a 5T imager. In another aspect, the device is a 4T imager.

Figure 4:
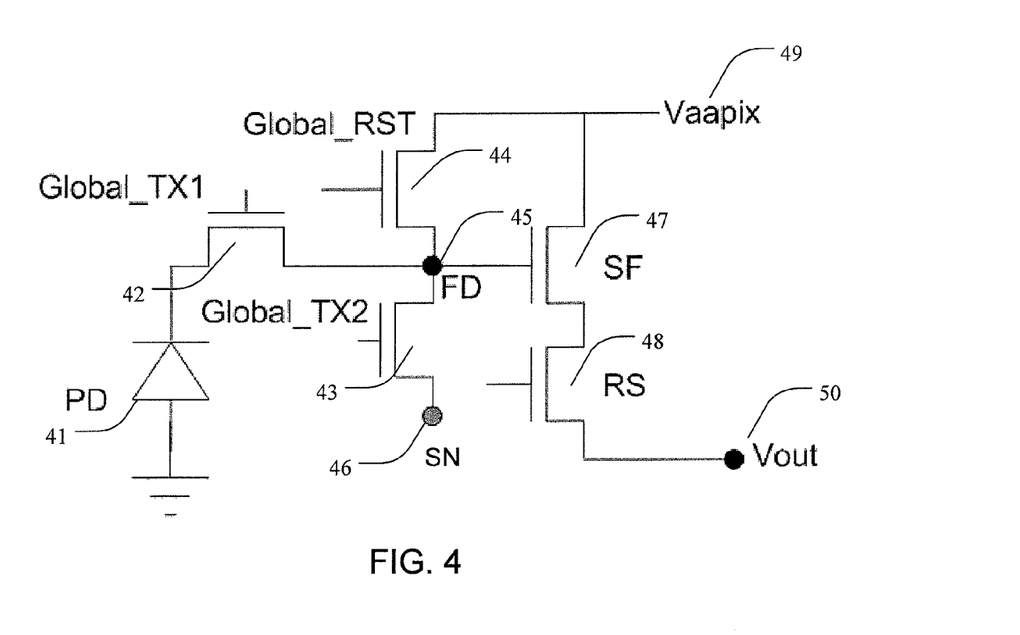
FIG. 4 is a schematic of a 5T CMOS imager in accordance with one aspect of the present disclosure.

In one aspect of the present disclosure, an example of a 5T imager is shown in FIG. 4. This global shutter mode 5T pixel can include a photodiode (PD) 41, a first global transfer transistor (Global_TX1) 42, a second global transfer transistor (Global_TX2) 43, and a global reset select transistor (Global_RST) 44. The 5T pixel further includes a floating diffusion region (FD) 45 and a storage node (SN) 46. In one aspect, the storage node is designed to have a similar capacitance as the floating diffusion region. In another aspect, the storage node can be designed with the capability to transfer charge freely bi-directionally. The 5T pixel also includes a source follower (SF) 47, a row select (RS) 48, a power supply voltage for the pixel array (Vaapix) 49, and the voltage out (Vout) 50. It should be noted that the size and dimensions of the global reset, transfer gate, transfer reset, as well as other elements of the device can be adjusted to optimize performance.

In another aspect, an array of 5T pixels is provided to form a photodiode imager device. Such a photodiode imager can include a plurality of transistor pixel devices according to any aspect of the present disclosure that are arranged into a plurality of rows. In one aspect, the first global transfer transistors from the plurality of transistor pixel devices are electrically coupled together, the second global transfer transistors from the plurality of transistor pixel devices are electrically coupled together, and the global reset select transistors from the plurality of transistor pixel devices are electrically coupled together. In another aspect, each transistor pixel device is a 5T pixel device including a row select transistor coupled to the source follower transistor. In another aspect, each transistor pixel device is a 4T pixel device that lacks a row select transistor. Both the 5T and 4T aspects have structures that are operable to provide CDS, anti-blooming protection, or both CDS and anti-blooming protection.

Figure 5:
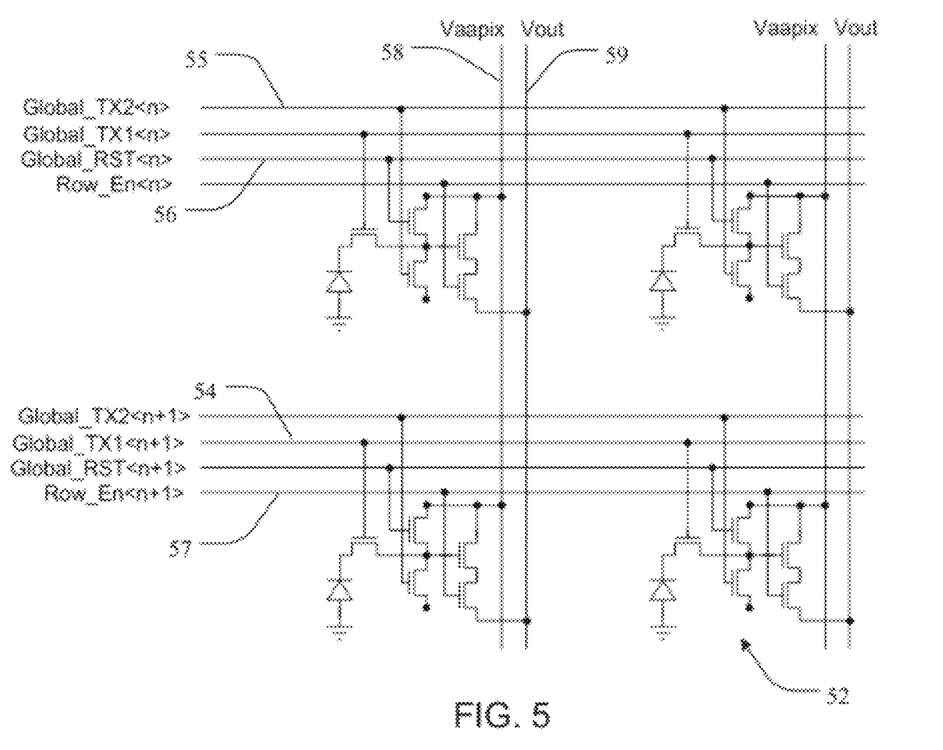
FIG. 5 is a schematic view of 5T imager array in accordance with another aspect of the present disclosure.

FIG. 5 shows an exemplary circuitry layout for an array of 5T pixels 52. Specific details on each 5T pixel are shown in FIG. 4. As can be seen in FIG. 5, the first global transfer transistors (Global_TX1) are electrically coupled together 5, the second global transfer transistors (Global_TX2) are electrically coupled together 55, and the global reset select transistors (Global_RST) are electrically coupled together 56. The row select transistors (Row_EN) are additionally electrically coupled together 57 across each row of 5T pixels. Additionally, power is delivered to each pixel via a power source (Vaapix) 58, and the pixels each have a Vout 59. It should be noted that additional circuitry layouts are considered to be within the present scope, provided the functionality of the 5T pixel and the associated array can be maintained.

Figure 6:
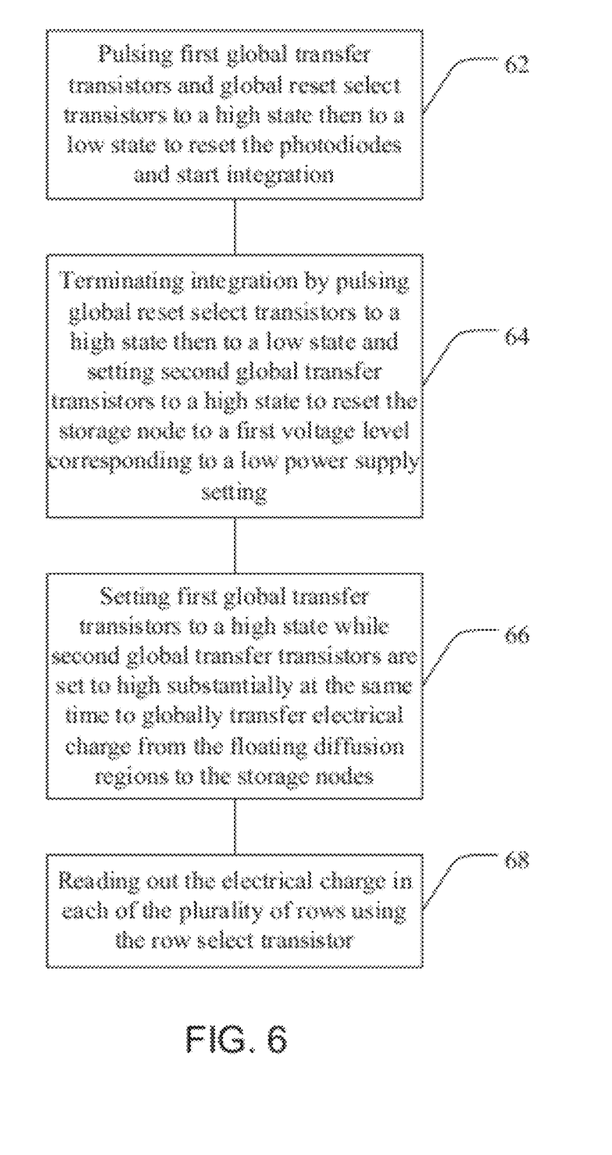
FIG. 6 is a flow diagram of a method of timing an imager array in accordance with another aspect of the present disclosure.

In one aspect, the present disclosure provides a method of timing a photodiode imager in a global shutter mode, such as the 5T imager described above. A flow diagram for such a method is shown in FIG. 6. Accordingly, such a method can include pulsing first global transfer transistors and global reset select transistors to a high state then to a low state to reset the photodiodes and start integration 62, terminating integration by pulsing global reset select transistors to a high state then to a low state and setting second global transfer transistors to a high state to reset the storage node to a first voltage level corresponding to a low power supply setting 64, and setting first global transfer transistors to a high state while second global transfer transistors are set to high substantially at the same time to globally transfer electrical charge from the floating diffusion regions to the storage nodes 66. The method can also include reading out the electrical charge in each of the plurality of rows using the row select transistor 68. It should be noted that setting an element to a high state or a low state can be any value sufficient to achieve the desired result, and can vary depending on the power source, the specific architecture of the device, and the like. Additionally, pulsing and element is intended to include briefly setting an element to a high state or to a low state for a time sufficient to achieve a desired result.

As has been described, imagers according to the present disclosure can include correlated double sampling (CDS). CDS is a technique for measuring a signal that allows for removal of an undesired offset and low frequency temporal noise (e.g. kTC noise for CMOS pixel). The output signal is thus measured twice: once in a known condition and once in an unknown condition. The value measured from the known condition is then subtracted from the unknown condition to generate a value with a known relation to the physical quantity being measured. In one aspect, a CDS operation can be performed on a row that is being read out from the imager. Such an operation can include setting the global reset select transistor of the row being read to a high state and setting the power supply to a high power supply setting to set the floating diffusion regions to the high power supply setting in the row being read. As a non-limiting example, the power supply can be increased from 2.8 V to a high power supply setting of 3.1 V. The electrical charge in the floating diffusion regions can then be read to obtain a first electrical charge value. The second transfer global transistor of the row being read can then be set to a high state to transfer electrical charge in the storage nodes to the floating diffusion regions of the row being read. Subsequently, the electrical charge in the floating diffusion regions can be read to obtain a second electrical charge value. The second charge value can then be subtracted from the first electrical charge value to obtain the CDS sampled output.

As has also been described, imagers according to the present disclosure can include anti-blooming protection. Anti-blooming protection protects against saturated pixels bleeding or overflowing into neighboring pixels. In one aspect, anti-blooming protection can include setting the global reset select transistors and the first global transfer transistors to an ON state (or high state) for rows that are not in integration or readout to thus provide anti-blooming protection across the imager array. A row is selected to be read and the row select transistor and the first global transistor are disconnected from the anti-blooming protection for that row. The row select transistor is then set to a high state for the row to be read and the electrical charge in the row is then read. The row select transistor and the first transfer global transistor is then set back to the anti-blooming state for the row that was read, and the process is continued for a subsequent row.

Figure 7:
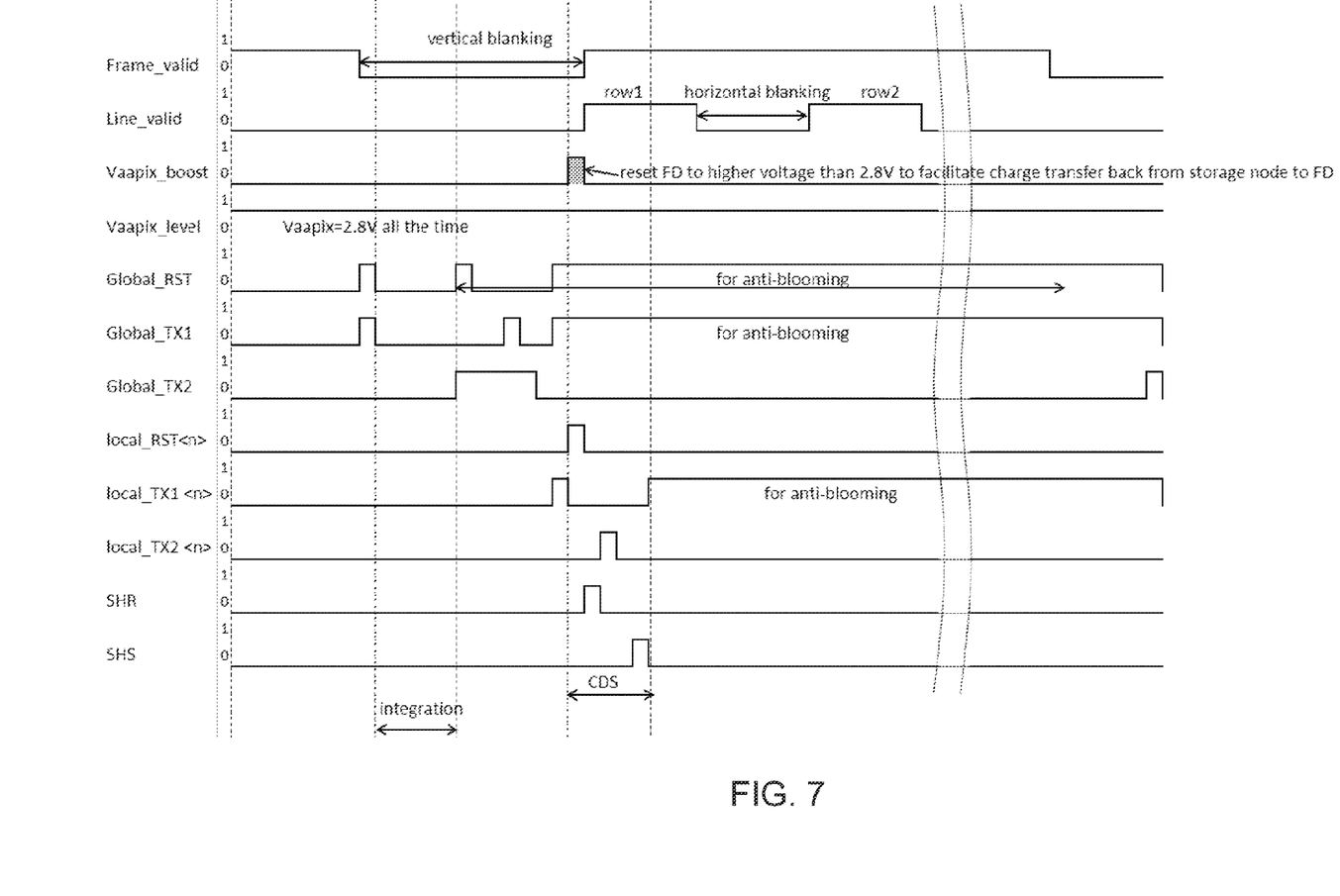
FIG. 7 is a timing sequence diagram for an imager array in accordance with yet another aspect of the present disclosure.

An exemplary timing diagram showing the functionality of a 5T imager array in global shutter mode having CDS and anti-blooming protection is shown in FIG. 7. Time in the diagram is flowing from left to right. As such, the pixel read out operation from the array is described in the following steps. It should be noted that in some aspects, the timing, order of operation, and other details can be varied from what is described, provided sufficiently similar results from the pixel read out operation are obtained.

1. To start integration for all pixels in the array, all Global_RST gates and all Global_TX1 gates in the array will be set to high for a time sufficient to reset all photodiodes and begin integration.

2. At the end of integration, all Global_RST gates and all Global_TX2 gates will go high at substantially the same time. This will reset storage node to the Vaapix setting (e.g. 2.8 V). This will reset storage node (SN) to a lower voltage than floating diffusion (FD) (See FIG. 4).

3. All Global_RST gates are set to low while all Global_TX2 gates remain high.

4. All Global_TX1 gates are set to high to globally transfer all the electrical charge from photodiode to the floating diffusion and then to the storage node.

5. The read out will still be carried out in a row-by-row basis. During read out, all Global_RST gates and all Global_TX1 gates will remain slightly high in the rows not being read to provide anti-blooming protection.

6. For a row being readout, its RST gate and TX1 gate are disconnected from the global anti-blooming operation. To read out a row, first, its RST gate will be set to high. At substantially the same time, the power supply voltage for the pixel array (Vaapix) will be boosted to a higher voltage setting (Vaapix_boost). As one non-limiting example, Vaapix can be set from its normal value of 2.8V to 3.1 V. As such, the floating diffusion (FD) will be set to the higher voltage setting (e.g. 3.1 V). The electrical charge in the floating diffusion (FD) is then read as the first reading. The TX2 gate of row being read with then be set to a high state to transfer the electrical charge from the storage node (SN) back to the floating diffusion (FD). The electrical charge is then read from the floating diffusion (FD) as the second reading. The second reading is then subtracted from the first reading to obtain the integrated value for that pixel. This will finish the CDS operation, and the RST and TX1 gates of current row will go back to high and remain at high for anti-blooming purpose. As such, anti-blooming is briefly interrupted during current row sampling.

As has been described, the storage node can be designed to have a similar capacitance as floating diffusion. Furthermore, in one aspect the TX2 transfer gate can be engineered so that the charge can be transferred freely in both directions. This can be beneficial to facilitate lag-free operation of the pixels. Such an array can provide low read noise with CDS operation, good anti-blooming protection during read out, low dark current since only one transfer gate is connected to photodiode, and is suitable for scaling down for large format sensors.

Figure 8:
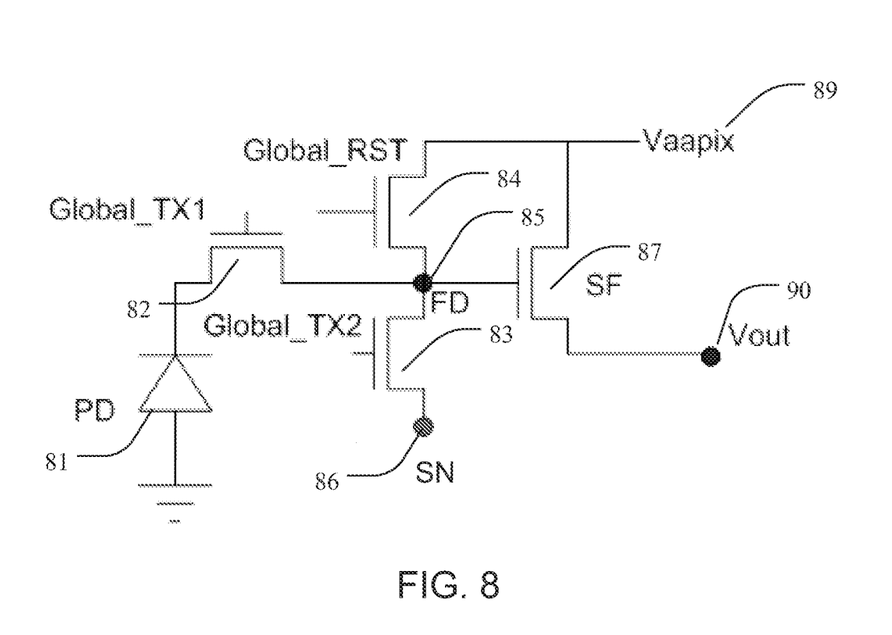
FIG. 8 is a schematic of a 4T CMOS imager in accordance with a further aspect of the present disclosure.

The present disclosure additionally provides, in one aspect, an example of a 4T imager that can be operated in global shutter mode, and has CDS operation and anti-blooming protection. As is shown in FIG. 8, the global shutter 4T imager includes a photodiode (PD) 81, a first global transfer transistor (Global_TX1) 82, a second global transfer transistor (Global_TX2) 83, and a global reset select transistor (Global_RST) 84. The 4T pixel further includes a floating diffusion region (FD) 85 and a storage node (SN) 86. In one aspect, the storage node is designed to have a similar capacitance as floating diffusion region. The 4T pixel also includes a source follower (SF) 87, a power supply voltage for the pixel array (Vaapix) 89, and the voltage out (Vout) 90, but does not include a row select (RS).

In another aspect, an array of 4T pixels is provided to form a photodiode imager device. Such a photodiode imager can include a plurality of transistor pixel devices according to any aspect of the present disclosure that are arranged into a plurality of rows. In one aspect, the first global transfer transistors from the plurality of transistor pixel devices are electrically coupled together, the second global transfer transistors from the plurality of transistor pixel devices are electrically coupled together, and the global reset select transistors from the plurality of transistor pixel devices are electrically coupled together. The 4T imager has a structure that is operable to provide CDS, anti-blooming protection, or both CDS and anti-blooming protection.

Figure 9:
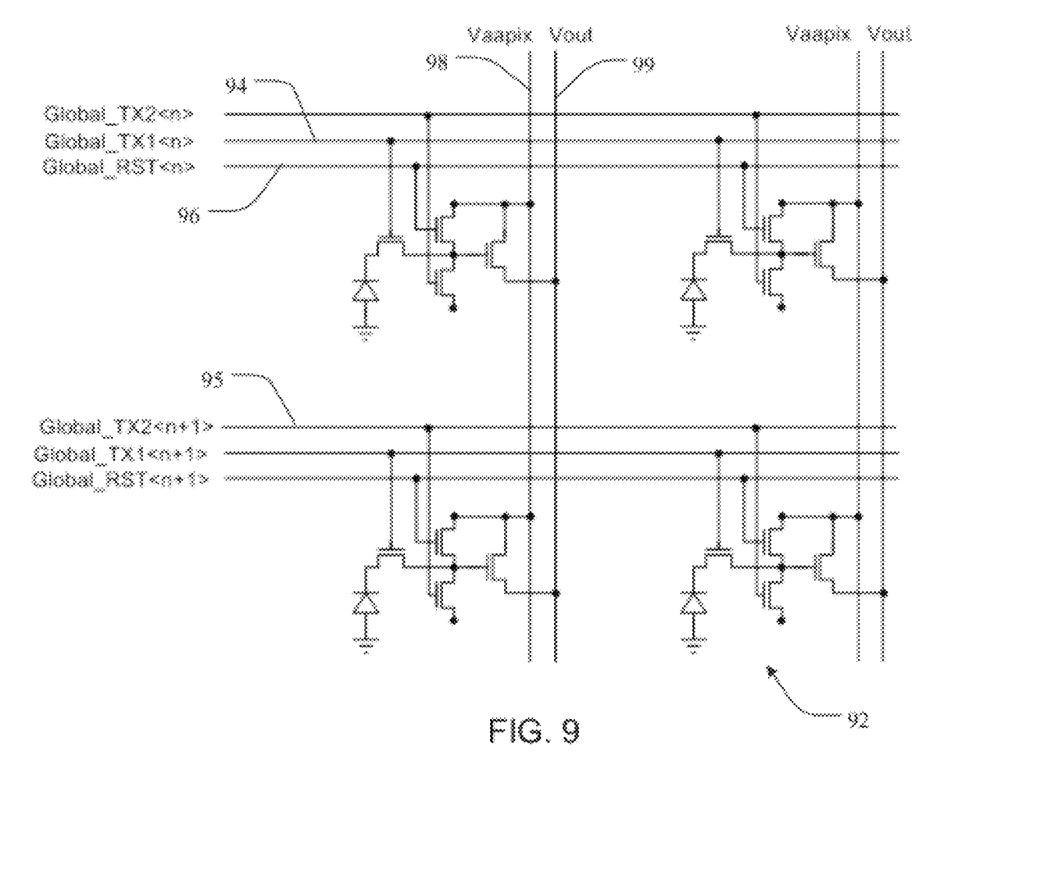
FIG. 9 is a schematic view of 4T imager array in accordance with another aspect of the present disclosure.

FIG. 9 shows an exemplary circuitry layout for an array of 4T pixels 92. Specific details on each 4T pixel are shown in FIG. 8. As can be seen in FIG. 9, the first global transfer transistors (Global_TX1) are electrically coupled together 94, the second global transfer transistors (Global_TX2) are electrically coupled together 95, and the global reset select transistors (Global_RST) are electrically coupled together 96. Additionally, power is delivered to each pixel via a power source (Vaapix) 98, and the pixels each have a Vout 99. It should be noted that additional circuitry layouts are considered to be within the present scope, provided the functionality of the 4T pixel and the associated array can be maintained.

Figure 10:
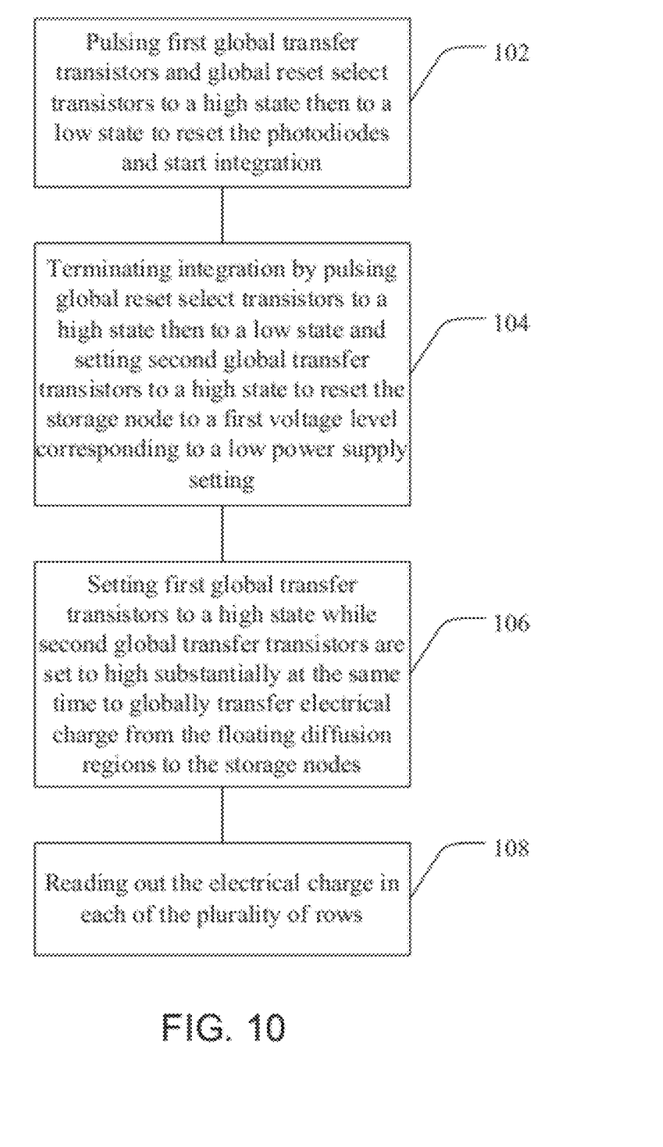
FIG. 10 is a flow diagram of a method of timing an imager array in accordance with another aspect of the present disclosure.

In one aspect, the present disclosure provides a method of timing a photodiode imager in a global shutter mode, such as the 4T imager described above that lacks a row select transistor. A flow diagram for such a method is shown in FIG. 10. Accordingly, such a method can include pulsing first global transfer transistors and global reset select transistors to a high state then to a low state to reset the photodiodes and start integration 102, terminating integration by pulsing global reset select transistors to a high state then to a low state and setting second global transfer transistors to a high state to reset the storage node to a first voltage level corresponding to a low power supply setting 104, and setting first global transfer transistors to a high state while second global transfer transistors are set to high substantially at the same time to globally transfer electrical charge from the floating diffusion regions to the storage nodes 106. The method can also include reading out the electrical charge in each of the plurality of rows 108. It should be noted that setting an element to a high state or a low state can be any value sufficient to achieve the desired result, and can vary depending on the power source, the specific architecture of the device, and the like. Additionally, pulsing and element is intended to include briefly setting an element to a high state or to a low state for a time sufficient to achieve a desired result.

The 4T imager array can be read out according to any known technique that does not include a row select transistor. In one aspect, for example, anti-blooming protection can be disabled for a selected row to be read, and the Global_RST is set to high for that row. Following reading out of the selected row, the power supply is set to a sufficiently low setting to reset the floating diffusion region of the selected row to substantially 0.0V to thus turn off the source follower transistor of the selected row. Anti-blooming is then reactivated for that row and the next row to be read is selected and the process is repeated. However, it can be beneficial during anti-blooming protection to turn on the Global_RST slightly to ensure that the floating diffusion voltage is well below the threshold voltage of source follower gate. This will ensure that the source follower gate will remain OFF and won't affect the read out.

Figure 11:
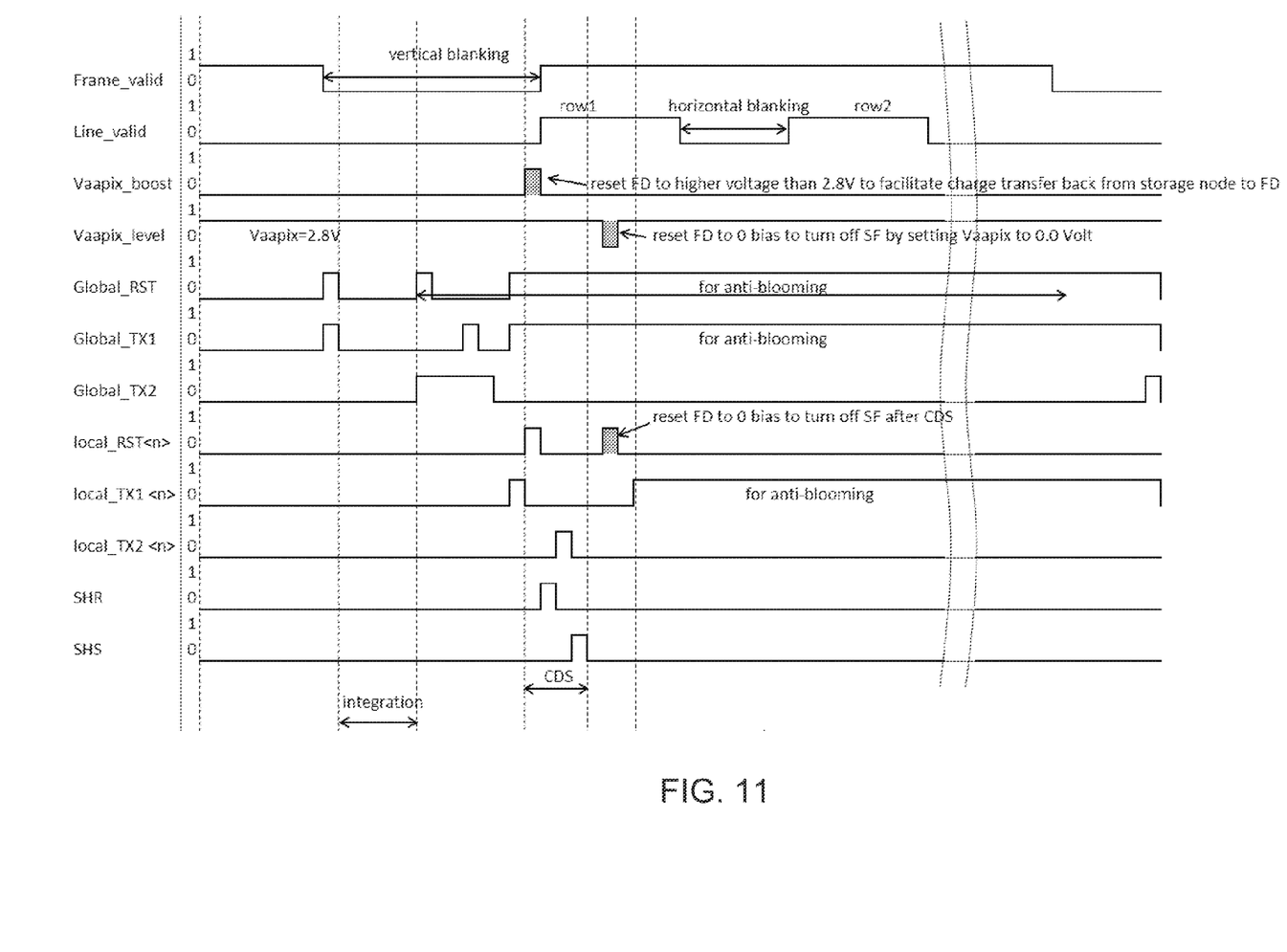
FIG. 11 is a timing sequence diagram for an imager array in accordance with another aspect of the present disclosure.

An exemplary timing diagram showing the functionality of a 4T imager array in global shutter mode having CDS and anti-blooming protection is shown in FIG. 11. Time in the diagram is flowing from left to right. The pixel operation timing is very similar to what was described in the timing diagram shown in FIG. 7, except for the end of row sampling operation after CDS. In this case the RST gates of the selected row will be high while the power supply is set to a sufficiently low setting (i.e. Vaapix is 0.0 V) to reset the floating diffusion (FD) to substantially 0.0V, which will effectively turn off the source follower (SF) gates of current row. In this manner, a "no-row-select pixel" timing is generated.

In addition, for all imager architectures according to aspects of the present disclosure, the location and dimensions of the floating diffusion region and transfer gates can affect the imager and/or pixel performance. For large pixels, for example, the distance from the edge of the transfer gate to the farthest corner of the photo-diode can affect the efficiency of charge transfer. The charge transfer can be less efficient as this distance increases. As the floating diffusion area is minimized, the corresponding capacitance is lower (partially offset by the larger parasitic component from the metal connections) and conversion gain is maximized.

The present architectures can be utilized with various pixels, photodiodes, and imagers, and as such, the present scope is not limited according to a particular photosensitive device. In some aspects, however, the various devices can be utilized with photosensitive devices that exhibit increased quantum efficiency over traditional photosensitive devices. An increase in the quantum efficiency can result in a large difference in the signal to noise ratio of the device. More complex structures can provide not only increased quantum efficiency but also good uniformity from pixel to pixel. In addition, such devices of the present disclosure exhibit increased responsivity as compared to traditional photosensitive devices. For example, in one aspect the responsivity can be greater than or equal to 0.8 A/W for wavelengths greater than 1000 nm for semiconductor substrate that is less than 100 µm thick.

Photosensitive imagers can be maintained under constant conditions (fixed voltage or current) to provide enhanced linearity and uniformity. Connections between the imager and the underlying device layers can be achieved using vias fabricated from a refractory metal, such as tungsten or tantalum. Placing storage elements under the imager may also provide various photonic benefits. For example, the entire pixel array may be dedicated to signal processing. This may enable higher performance by permitting access to low level pixel signals. Furthermore, massively parallel operations can be performed by pixel processors. For example, analog to digital conversion, noise reduction (i.e., true correlated double sampling), power conditioning, nearest neighbor pixel processing, compression, fusion, and color multiplexing operations can be performed.

Regarding the photodiodes, a variety of semiconductor materials are contemplated for use with such devices. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof. Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, AlxGal-xAs), indium gallium arsenide (InGaAs, InxGal-xAs), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

Furthermore, the semiconductor material can be of any thickness that allows electromagnetic radiation detection and conversion functionality, and thus any such thickness of semiconductor material is considered to be within the present scope. In some aspects a textured region can be applied to the semiconductor material to increase the efficiency of the device such that the semiconductor material can be thinner than has previously been possible. Decreasing the thickness of the semiconductor reduces the amount of the often costly semiconductor material required to make such a device. In one aspect, for example, the semiconductor material has a thickness of from about 500 nm to about 50 µm. In another aspect, the semiconductor material has a thickness of less than or equal to about 500 µm. In yet another aspect, the semiconductor material has a thickness of from about 2 µm to about 10 µm. In a further aspect, the semiconductor material can have a thickness of from about 5 µm to about 750 µm. In yet a further aspect, the semiconductor material can have a thickness of from about 5 µm to about 100 µm.

Additionally, various types of semiconductor material are contemplated, and any such material that can be incorporated into an electromagnetic radiation detection device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific nonlimiting examples include amorphous silicon or amorphous selenium.

One effective method of producing a textured region is though laser processing. Such laser processing allows discrete locations of the semiconductor substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection. The laser treated region can be associated with the surface nearest the impinging electromagnetic radiation, or the laser treated surface can be associated with a surface opposite in relation to impinging electromagnetic radiation, thereby allowing the radiation to pass through the semiconductor material before it hits the laser treated region.

In one aspect, for example, a target region of the semiconductor material can be irradiated with laser radiation to form a textured region. Examples of such processing have been described in further detail in U.S. Pat. Nos. 7,057,256, 7,354, 792 and 7,442,629, which are incorporated herein by reference in their entireties. Briefly, a surface of a semiconductor material is irradiated with laser radiation to form a textured or surface modified region. Such laser processing can occur with or without a dopant material. In those aspects whereby a dopant is used, the laser can be directed through a dopant carrier and onto the semiconductor surface. In this way, dopant from the dopant carrier is introduced into the target region of the semiconductor material. Such a region incorporated into a semiconductor material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of semiconductor material includes exposing the laser radiation to a dopant such that irradiation incorporates the dopant into the semiconductor. Various dopant materials are known in the art, and are discussed in more detail herein.

Thus the surface of the semiconductor material is chemically and/or structurally altered by the laser treatment, which may, in some aspects, result in the formation of surface features appearing as microstructures or patterned areas on the surface and, if a dopant is used, the incorporation of such dopants into the semiconductor material. In some aspects, the features or microstructures can be on the order of 50 nm to 20 µm in size and can assist in the absorption of electromagnetic radiation. In other words, the textured surface can increase the probability of incident radiation being absorbed by the semiconductor material.

The type of laser radiation used to surface modify a semiconductor material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a semiconductor material. A short-pulsed laser is one capable of producing femtosecond, picosecond and/or nanosecond pulse durations. Laser pulses can have a central wavelength in a range of about from about 10 nm to about 8 µm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths are in the range of from about 50 to 500 femtoseconds.

The number of laser pulses irradiating a target region can be in a range of from about 1 to about 2000. In one aspect, the number of laser pulses irradiating a semiconductor target region can be from about 2 to about 1000. Further, the repetition rate or frequency of the pulses can be selected to be in a range of from about 10 Hz to about 10 µHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

A variety of dopant materials are contemplated, and any such material that can be used in the laser treatment process to surface modify a semiconductor material according to aspects of the present disclosure is considered to be within the present scope. It should be noted that the particular dopant utilized can vary depending on the semiconductor material being laser treated, as well as the intended use of the resulting semiconductor material. For example, the selection of potential dopants may differ depending on whether or not tuning of the photosensitive device is desired.

A dopant can be either electron donating or hole donating. In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, H$_2$S, SF$_6$, SO$_2$, and the like, including combinations thereof. In one specific aspect, the dopant can be S. Sulfur can be present at an ion dosage level of between about 5×10$^{14}$ and about 1×10$^{16}$ ions/cm$^2$. Non-limiting examples of fluorine-containing compounds can include ClF$_3$, PF$_5$, F$_2$ SF$_6$, BF$_3$, GeF$_4$, WF$_6$, SiF$_4$, HF, CF$_4$, CHF$_3$, CH$_2$F$_2$, CH$_3$F, C$_2$F$_6$, C$_2$HF$_5$, C$_3$F$_8$, C$_4$F$_g$, NF$_3$, and the like, including combinations thereof. Non-limiting examples of boron-containing compounds can include B(CH$_3$)$_3$, BF$_3$, BCl$_3$, BN, C$_2$B$_{10}$H$_{12}$, borosilica, B$_2$H$_6$, and the like, including combinations thereof. Non-limiting examples of phosphorous-containing compounds can include PF$_5$, PH$_3$, and the like, including combinations thereof. Non-limiting examples of chlorine-containing compounds can include Cl$_2$, SiH$_2$Cl$_2$, HCl, SiCl$_4$, and the like, including combinations thereof. Dopants can also include arsenic-containing compounds such as AsH$_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, H$_2$S, SF$_6$, or mixtures thereof. In yet another specific aspect, the dopant can be SF$_6$ and can have a predetermined concentration range of about 5.0×10$^{-8}$ mol/cm$^3$ to about 5.0×10$^{-4}$ mol/cm$^3$. SF$_6$ gas is a good carrier for the incorporation of sulfur into the semiconductor material via a laser process without significant adverse effects on the semiconductor material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

The semiconductor substrate can be annealed for a variety of reasons, including dopant activation, semiconductor material repair, and the like. In those aspects including a laser textured region, the semiconductor material can be annealed prior to laser treatment, following laser treatment, during laser treatment, or both prior to and following laser treatment. Annealing can enhance the semiconductive properties of the device, including increasing the photoresponse properties of the semiconductor materials. Additionally, annealing can reduce damage done by the lasing process. Although any known anneal can be beneficial and would be considered to be within the present scope, annealing at lower temperatures can be particularly useful. Such a "low temperature" anneal can greatly enhance the photoconductive gain and external quantum efficiency of devices utilizing such materials. In one aspect, for example, the semiconductor material can be annealed to a temperature of from about 300° C. to about 110° C.°. In another aspect, the semiconductor material can be annealed to a temperature of from about 500° C. to about 900° C. In yet another aspect, the semiconductor material can be annealed to a temperature of from about 700° C. to about 800° C. In a further aspect, the semiconductor material can be annealed to a temperature that is less than or equal to about 850° C.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of timing a photodiode imager device to function in a global shutter mode, wherein the photodiode imager device includes a plurality of transistor pixel devices arranged into a plurality of rows, wherein each transistor pixel device further includes: a photodiode coupled to a floating diffusion region, a storage node, and a power supply, wherein the floating diffusion region is coupled between the photodiode and the power supply; a first global transfer transistor coupled between the photodiode and the floating diffusion region for gating between the photodiode and the floating diffusion region; a second global transfer transistor coupled between the floating diffusion region and the storage node for gating between the floating diffusion region and the storage node; a global reset select transistor coupled between the floating diffusion region and the power supply, wherein an open state of the global reset select transistor prevents accumulation of electrical charge at the photodiodes: and a source follower transistor coupled to the floating diffusion region and to the power supply, the source follower being operable to receive electrical signal from the floating diffusion region; wherein the first global transfer transistors from the plurality of transistor pixel devices are electrically coupled together, the second global transfer transistors from the plurality of transistor pixel devices are electrically coupled together, and the global reset select transistors from the plurality of transistor pixel devices are electrically coupled together, and wherein each transistor pixel device is a five transistor pixel device including a row select transistor coupled to the source follower transistor, comprising: pulsing first global transfer transistors and global reset select transistors to a high state then to a low state to reset the photodiodes and start integration; terminating integration by pulsing global reset select transistors to a high state then to a low state and setting second global transfer transistors to a high state to reset the storage node to a first voltage level corresponding to a low power supply setting; setting first global transfer transistors to a high state while second global transfer transistors are set to high substantially at the same time to globally transfer electrical charge from the floating diffusion regions to the storage nodes; and reading out the electrical charge in each of the plurality of rows using the row select transistor.

2. The method of claim 1, wherein reading out the electrical charge in each of the plurality of rows further includes correlated double sampling.

3. The method of claim 2, wherein the correlated double sampling further includes:
setting the global reset select transistor of a row being read to a high state and setting the power supply to a high power supply setting to set the floating diffusion regions to the high power supply setting in the row being read;
reading the electrical charge in the floating diffusion regions and obtaining a first electrical charge value;
setting the second transfer global transistor of the row being read to a high state to transfer electrical charge in the storage nodes to the floating diffusion regions of the row being read;
reading the electrical charge in the floating diffusion regions and obtaining a second electrical charge value; and subtracting the second electrical charge value from the first electrical charge value to obtain a correlated double sampling output.

4. The method of claim 1, wherein reading out the electrical charge in each of the plurality of rows further includes anti-blooming protection.

5. A method of timing a photodiode imager device to function in a global shutter mode, wherein the photodiode imager device includes a plurality of transistor pixel devices arranged into a plurality of rows, wherein each transistor pixel device further includes:
   a photodiode coupled to a floating diffusion region, a storage node, and a power supply, wherein the floating diffusion region is coupled between the photodiode and the power supply;
   a first global transfer transistor coupled between the photodiode and the floating diffusion region for gating between the photodiode and the floating diffusion region;
   a second global transfer transistor coupled between the floating diffusion region and the storage node for gating between the floating diffusion region and the storage node;
   a global reset select transistor coupled between the floating diffusion region and the power supply, wherein an open state of the global reset select transistor prevents accumulation of electrical charge at the photodiodes; and
   a source follower transistor coupled to the floating diffusion region and to the power supply, the source follower being operable to receive electrical signal from the floating diffusion region;
   wherein the first global transfer transistors from the plurality of transistor pixel devices are electrically coupled together, the second global transfer transistors from the plurality of transistor pixel devices are electrically coupled together, and the global reset select transistors from the plurality of transistor pixel devices are electrically coupled together, and wherein each transistor pixel device is a five transistor pixel device including a row select transistor coupled to the source follower transistor, comprising:
   pulsing first global transfer transistors and global reset select transistors to a high state then to a low state to reset the photodiodes and start integration;
   terminating integration by pulsing global reset select transistors to a high state then to a low state and setting second global transfer transistors to a high state to reset the storage node to a first voltage level corresponding to a low power supply setting;
   setting first global transfer transistors to a high state while second global transfer transistors are set to high at the same time to globally transfer electrical charge from the floating diffusion regions to the storage nodes; and
   reading out the electrical charge in each of the plurality of rows.

6. The method of claim 5, wherein reading out the electrical charge in each of the plurality of rows further includes:
   selecting a row to be read;
   setting the global reset select transfer transistor for the selected row to high; and
   setting the power supply to a sufficiently low setting to reset the floating diffusion region of the selected row to substantially 0.0V to turn off the source follower transistor of the selected row.

7. The method of claim 5, wherein reading out the electrical charge in each of the plurality of rows further includes correlated double sampling.

8. The method of claim 7, wherein the correlated double sampling further includes:
   setting the global reset select transistor for a row being read to a high state and setting the power supply to a high power supply setting to set the floating diffusion regions to the high power supply setting in the row being read;
   reading the electrical charge in the floating diffusion regions and obtaining a first electrical charge value;
   setting the second transfer global transistor of the row being read to a high state to transfer electrical charge in the storage nodes to the floating diffusion regions of the row being read;
   reading the electrical charge in the floating diffusion regions and obtaining a second electrical charge value; and
   subtracting the second electrical charge value from the first electrical charge value to obtain a correlated double sampling output.

9. The method of claim 5, wherein reading out the electrical charge in each of the plurality of rows further includes anti-blooming protection.

10. The method of claim 9, wherein the anti-blooming protection further includes:
    setting the global reset select transistors and the first global transfer transistors to an ON state for rows that are not in integration or readout to provide anti-blooming protection;
    selecting a row to be read;
    setting the global reset select transfer transistor for the selected row to high; and
    setting the power supply to a sufficiently low setting to reset the floating diffusion region of the selected row to substantially 0.0V to turn off the source follower transistor of the selected row.

* * * * *